(12) United States Patent
Doyle et al.

(10) Patent No.: US 6,563,347 B2
(45) Date of Patent: May 13, 2003

(54) REDUNDANT COMPARATOR DESIGN FOR IMPROVED OFFSET VOLTAGE AND SINGLE EVENT EFFECTS HARDNESS

(75) Inventors: Brent R. Doyle, Malabar, FL (US); James W. Swonger, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 19 days.

(21) Appl. No.: 09/973,106

(22) Filed: Oct. 9, 2001

(65) Prior Publication Data

US 2002/0060585 A1 May 23, 2002

Related U.S. Application Data

(60) Provisional application No. 60/255,014, filed on Dec. 12, 2000.

(51) Int. Cl.[7] ................................................. H03K 5/22
(52) U.S. Cl. ............................................. 327/65; 327/58
(58) Field of Search ................................ 327/58, 62, 63, 327/65, 71, 77, 78, 79, 80; 330/252, 307

(56) References Cited

U.S. PATENT DOCUMENTS

| | | | | |
|---|---|---|---|---|
| 4,752,766 A | * | 6/1988 | Shimizu et al. ............. | 341/159 |
| 5,029,305 A | * | 7/1991 | Richardson .................. | 341/158 |
| 5,140,188 A | * | 8/1992 | Burns ........................... | 327/195 |
| 5,373,400 A | * | 12/1994 | Kovacs ......................... | 327/62 |
| 5,903,717 A | | 5/1999 | Wardrop ................... | 395/182.1 |
| 5,923,830 A | | 7/1999 | Fuchs et al. ............ | 395/182.09 |
| 5,936,566 A | * | 8/1999 | Park ............................. | 341/159 |
| 5,959,564 A | * | 9/1999 | Gross, Jr. .................... | 341/118 |
| 6,034,631 A | * | 3/2000 | Gross, Jr. .................... | 341/160 |
| 6,040,718 A | * | 3/2000 | Henry ......................... | 327/407 |
| 6,098,929 A | | 8/2000 | Falbel ......................... | 244/171 |
| 6,127,864 A | | 10/2000 | Mavis et al. ................. | 327/144 |
| 6,141,770 A | | 10/2000 | Fuchs et al. .................. | 714/11 |
| 6,154,498 A | * | 11/2000 | Dabral et al. ................ | 327/141 |
| 6,278,740 B1 | * | 8/2001 | Nordyke ...................... | 327/63 |

* cited by examiner

Primary Examiner—Timothy P. Callahan
Assistant Examiner—Linh Nguyen
(74) Attorney, Agent, or Firm—Allen, Dyer, Doppelt, Milbrath & Gilchrist, P.A.

(57) ABSTRACT

An analog comparator architecture has improved immunity to single event effects and variations in input offset voltage. A conventional single analog comparator-based circuit is replaced with plural comparators, driving a "majority vote" logic block. The effective input offset voltage of the multi-comparator design is the middle one of the individual comparators' input offset voltages. A single event upset on any comparator may momentarily perturb its output into the incorrect state; however, the output of the majority voting logic block will remain in the correct state, as only one comparator is upset. In addition, where a heavy ion strike on any comparator's bias current source causes a momentary loss of bias current, this upsets only one comparator, so that the output of the voting logic block is unaffected.

9 Claims, 1 Drawing Sheet

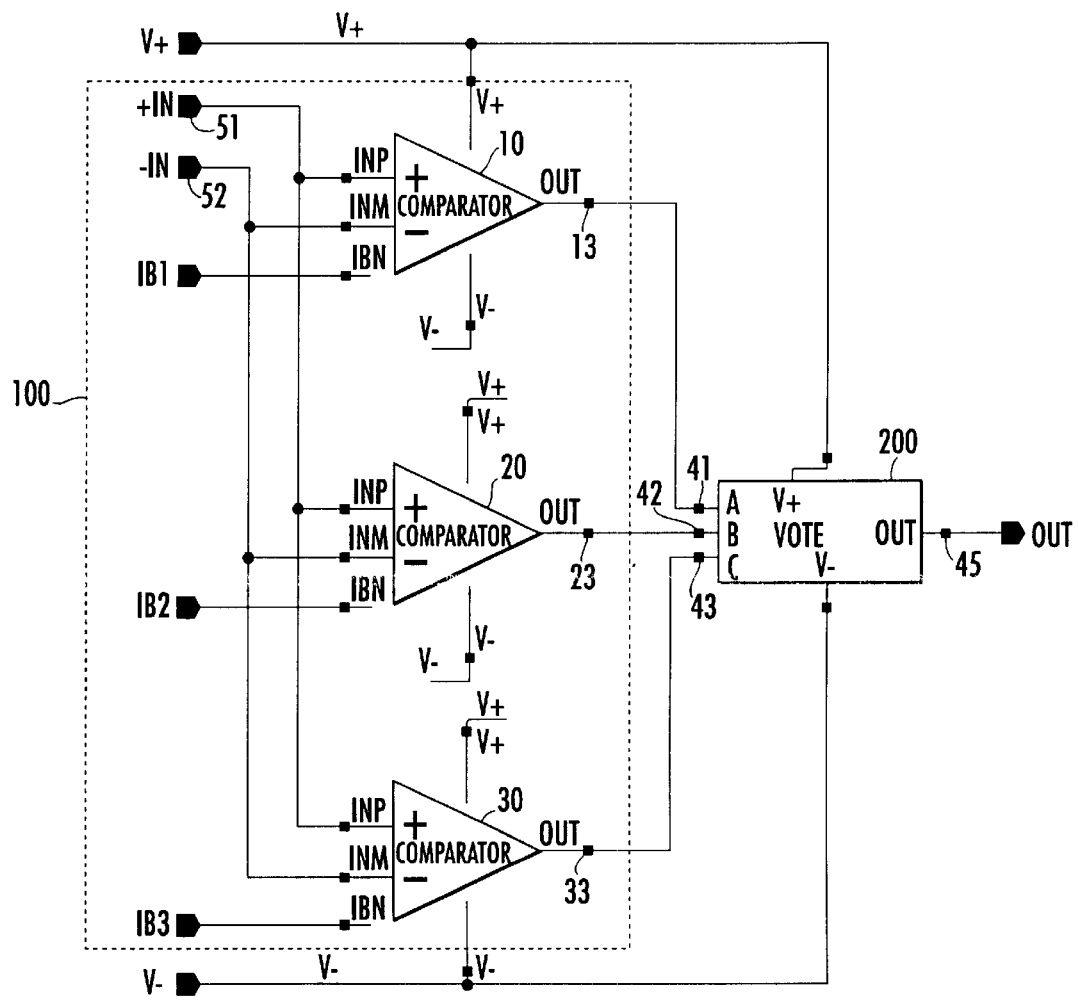

US 6,563,347 B2

REDUNDANT COMPARATOR DESIGN FOR IMPROVED OFFSET VOLTAGE AND SINGLE EVENT EFFECTS HARDNESS

CROSS-REFERENCE TO RELATED APPLICATIONS

The present application claims the benefit of co-pending U.S. Application Ser. No. 60/255,014, filed Dec. 12, 2000, by B. Doyle et al, entitled: "REDUNDANT COMPARATOR DESIGN FOR IMPROVED OFFSET VOLTAGE AND SINGLE EVENT EFFECTS HARDNESS," assigned to the assignee of the present application and the disclosure of which is incorporated herein.

FIELD OF THE INVENTION

The present invention relates in general to electronic circuits, in particular analog voltage comparators, and is especially directed to a new and improved analog comparator architecture having improved immunity to single event effects (upsets, transients) and variations in input offset voltage.

BACKGROUND OF THE INVENTION

Semiconductor circuits employed in environments prone to incidence of cosmic rays and high energy particles can be disturbed or interrupted by charge deposit anomalies associated with such incidence, to result in what are commonly termed single event effects (SEEs). These effects can include Single Event Transients (SET), where electrical signals are upset from their normal levels, but return to the proper value over time, or single event upsets (SEUs), where the perturbation flips or inverts the state of a storage element, thus creating an incorrect an incorrect logic state that does not return to its correct value over time.

Typical, but non-limiting examples of environments that are subject to such events or upsets include spaceborne systems, as well as airborne and terrestrial systems that operate in the vicinity of the earth's magnetic poles. Moreover, as improvements in semiconductor manufacturing techniques continue to reduce feature size (and thus increase integration density), there is an escalating probability of event upsets and effects in such systems.

Up to the present, major industry focus has been in the digital arena, particularly digital signal processing applications, where a single bit error caused by an SEU or SEE may cause substantial corruption of the operation of an entire digital system. Efforts to combat the problem in digital applications have included installation of redundant or parallel digital subsystems (including separately clocked or sampling schemes), coupled with majority voting techniques to 'mask' out effects of such event upsets. In contrast, their potential impact on the operation of analog systems has not been substantially pursued, principally due to the fact that the generally linear behavior and recovery properties of analog devices provide a measure of inherent immunity against such events.

However, as increasing numbers of electronic systems, such as high data rate telecommunication systems, are implemented as an integration of both high density analog and digital components in a common support and signal feed and distribution architecture, event upset-sourced anomalies in analog components may propagate and thereby corrupt downstream digital components.

In addition to their susceptibility to single event effects and upsets, analog circuits that employ a built-in reference parameter, such as comparator matched bias current, are prone to exhibit respectively different operational behaviors associated with differences in manufacturing parameters, device mismatches, thermal gradients, and the like. For example, for a given identical comparator design, it can be expected that even the slightest variations in processing conditions of an integrated circuit fabrication methodology will produce comparator circuits having slightly different input offset voltages.

SUMMARY OF THE INVENTION

In accordance with the present invention, the above described single event and differential input offset voltage mismatch problem that can occur in analog comparator circuits is effectively obviated by a new and improved comparator architecture that replaces a conventional single analog comparator-based design with an odd plurality of (e.g., three) comparators, whose outputs drive a "majority vote" logic block. Each comparator is coupled to receive a respective bias current from an associated bias current source, and has a pair of complementary polarity +/− inputs coupled to respective (+) and (−) voltage input ports.

Each comparator of the triple comparator input stage is operative to drive the state of its output to one of two logical states ('0'/'1') depending upon whether its differential input voltage is greater than the comparator's internal offset voltage. As each comparator can be expected to have a slightly different input offset voltage due to device mismatches, thermal gradients, and the like, the effective input offset voltage of the multi-comparator input stage is the value of the middle one of the three individual comparators' offset voltages.

A single event upset (e.g. heavy ion strike) on any comparator within the input stage can cause its output to momentarily transition to the incorrect state. However, the output of the majority voting logic block will remain in the correct state, as only one comparator is upset, a "majority vote" on the outputs of the other two comparators producing the correct logic state. Also, a heavy ion strike on any of the bias current sources can cause a momentary loss of bias current. However, this would upset only one of the odd multiple number of comparators in the multi-comparator input stage, so that the output of the majority vote logic block will remain correct.

BRIEF DESCRIPTION OF THE DRAWINGS

The single FIGURE shows the circuit architecture of the improved analog comparator architecture of the present invention.

DETAILED DESCRIPTION

Attention is now directed to the single figure which shows the circuit configuration of a voltage comparator architecture having improved input offset voltage and significantly improved single event transient hardness in accordance with the invention. As shown therein the comparator comprises an input stage 100 containing an odd plurality of differential comparators 10, 20 and 30 (three in the example shown), respective outputs 13, 23 and 33 of which are coupled to inputs 41, 42 and 43 of an output stage 200. Each differential comparator is coupled to receive a respective bias current IBi from associated redundant bias current sources, such as a current mirrors, and has a pair of complementary polarity +/− inputs coupled to respective (+) and (−) voltage input ports 51 and 52.

Each comparator is operative to drive the state of its output to one of two logical states (0/1) depending upon whether its differential input voltage is greater than the comparator's internal offset voltage. As a non-limiting example, if the differential voltage exceeds the offset voltage, the comparator's output may be driven to a logical '1' state, whereas if the differential voltage does not exceed (is less than) the offset voltage, the comparator's output may be driven to a logical '0' state. The output stage 200, to which each comparator output is coupled, comprises a majority voting logic block, whose output 45 is representative of the logic state of the majority of comparator outputs. The majority voting logic block may be formed using SEE hardening techniques to improve its immunity to heavy ion strikes.

As pointed out above, in the present example of a triple comparator front end stage, each of the three comparators 10, 20 and 30 can be expected to have a slightly different input offset voltage due to device mismatches, thermal gradients, etc. Therefore, the effective input offset voltage of the multi-comparator input stage 100 is the middle one of the three individual comparators' offset voltages. As a non-limiting example, let the three individual offset voltages of the illustrated circuit be −1 mV, 0 mV and +2 mV. In this case, the effective offset voltage of the triple comparator-based input stage 100 will be 0 mV (as two of the three comparators will have their outputs correct at that offset voltage). For a normal distribution of offset voltages about 0V (the goal of a good comparator design), the use of a multiple (e.g., three) comparator-based input stage serves to significantly tighten the standard deviation (as it ignores any single worst case comparator's offset voltage). This improves the performance of the overall circuit and may eliminate wafer trimming in critical applications.

A heavy ion strike on any comparator within the input stage 100 may result in its output momentarily going to the incorrect state. Should this occur, the output 45 of the majority voting logic block 200 will remain in the correct state, as only one comparator is upset, since the other two comparators produce the correct logic state. Thus, by "majority vote" the logic state of the output 45 remains correct. In addition, a heavy ion strike on any of the bias current sources supplying respective bias currents IB1, IB2 and IB3 can cause a momentary loss of bias current. However, this would upset only one of the odd multiple number (three, in the present example) of comparators in the triple comparator input stage 100. Therefore, the output 45 of the voting logic block 200 will remain correct.

As will be appreciated from the foregoing description, the present invention is effective to obviate the single event and input offset voltage mismatch problem that can occur in conventional analog comparator circuits by an architecture that replaces a single analog comparator-based design with by an odd plurality of (e.g., three) comparators, whose outputs drive a "majority vote" logic block. The effective input offset voltage of the multi-comparator design of the invention is the middle one of the individual comparators' offset voltages. While a single event upset on any comparator within the input stage may momentarily perturb its output into the incorrect state, the output of the majority voting logic block will remain in the correct state, as only one comparator is upset, since the other comparators produce the correct logic state.

In addition, a heavy ion strike on any comparator's bias current source can cause a momentary loss of bias current. Again, however, this would upset only one of the comparators, so that the output of the voting logic block is unaffected. It will also be appreciated that the present invention may be used with numerous analog comparators, such as complementary metal oxide field-effect (CMOS), Bipolar, and BiCMOS comparators, for example. Moreover, the present invention is particularly applicable to applications requiring improved offset voltage without adding wafer trim.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. An upset event-resistant comparator circuit comprising:
   a plurality of differential comparators, having inputs thereof coupled in parallel to receive a differential input voltage, and outputs thereof driven to one of two logical states in accordance with a relationship between said differential input voltage and respective offset voltages thereof, such that the effective offset voltage of said plurality of differential comparators is the middle one of said respective offset voltages; and
   a majority vote output stage having inputs thereof coupled to said outputs of said plurality of differential comparators, and being operative to generate an output in accordance with the majority of logical states of the outputs of said plurality of differential comparators.

2. The upset event resistant comparator circuit according to claim 1, wherein said plurality of differential comparators comprises at least three differential comparators.

3. The upset event resistant comparator circuit according to claim 1, wherein each differential comparator is coupled to a respective bias current source.

4. A method of generating an output value representative of one of two logical states in accordance with a relationship between a differential input voltage and an input offset voltage comprising the steps of:
   (a) coupling said differential input voltage to a plurality of differential comparators having respective offset voltages that are not necessarily the same, and which are operative to drive outputs thereof to one of said two logical states in accordance with a relationship between said differential input voltage and said respective offset voltages thereof, such that the effective offset voltages of said plurality of differential comparators is the middle one of said respective offset voltages; and
   (b) generating said output value in accordance with the majority of logical states of the outputs of said plurality of differential comparators.

5. The method according to claim 4, wherein said plurality of differential comparators comprises at least three differential comparators.

6. The method according to claim 4, wherein each differential comparator is biased by a respective bias current source.

7. A method of effectively immunizing an analog comparator against single event effects and variations in input offset voltage comprising the steps of:
   (a) configuring said analog comparator of a plurality of differential comparators, having inputs thereof coupled in parallel to receive a differential input voltage, and outputs thereof driven to one of two logical states in accordance with a relationship between said input voltage differential and respective input offset voltages thereof, such that the effective input offset voltage of said analog comparator is the middle one of said respective input offset voltages; and (b) coupling said outputs of said plurality of differential comparators to a majority vote output stage that is operative to generate an output in accordance with the majority of logical states of the outputs of said plurality of differential comparators.

8. The method according to claim 7, wherein said plurality of differential comparators comprises three differential comparators.

9. The method according to claim 7, wherein each differential comparator is coupled to a respective bias current.

* * * * *